US010686540B2

(12) United States Patent
Abadie et al.

(10) Patent No.: US 10,686,540 B2
(45) Date of Patent: Jun. 16, 2020

(54) ANECHOIC TEST CHAMBER, TEST SYSTEM AND TEST METHOD FOR TESTING THE ANTENNAS OF A DEVICE UNDER TEST

(71) Applicant: Rohde & Schwarz GmbH & Co. KG, München (DE)

(72) Inventors: Vincent Abadie, Hoehenschaeftlarn (DE); Corbett Rowell, Munich (DE); Benoit Derat, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/419,859

(22) Filed: May 22, 2019

(65) Prior Publication Data
US 2020/0007245 A1 Jan. 2, 2020

(30) Foreign Application Priority Data

May 24, 2018 (EP) .................................... 18173963

(51) Int. Cl.
*H04B 17/29* (2015.01)
*H04B 7/0413* (2017.01)

(52) U.S. Cl.
CPC ........... *H04B 17/29* (2015.01); *H04B 7/0413* (2013.01)

(58) Field of Classification Search
CPC ...... H04B 17/21; H04B 17/391; H04B 17/29; H04B 17/102; H04B 17/101; H04B 17/0087; H01Q 15/14; H01Q 21/061
See application file for complete search history.

(56) References Cited

U.S. PATENT DOCUMENTS

2010/0113011 A1   5/2010  Gregg et al.
2010/0285753 A1*  11/2010  Foegelle ............ H04B 17/3911
                                            455/67.12
(Continued)

FOREIGN PATENT DOCUMENTS

EP    2 747 203 A1   6/2014
EP    3 182 619 A1   6/2017
JP    H11-304860 A  11/1999

OTHER PUBLICATIONS

Extended European search report for European Patent Application No. 18173963.2, dated Nov. 13, 2018, 9 pages.

Primary Examiner — Thanh C Le
(74) Attorney, Agent, or Firm — Westman, Champlin & Koehler, P.A.

(57) ABSTRACT

This application relates to an anechoic test chamber for testing antennas of a device under test (DUT), the test chamber comprising: a test area having a test surface for receiving the DUT, wherein in a test mode the test surface forms a region of measurement of the DUT and wherein the DUT comprises at least one antenna array having a plurality of multi-input multi-output (MIMO) antennas, at least one reflector compact antenna test range (CATR) comprising a first measurement antenna and one shaped reflector, wherein the reflector is used to generate a first quiet zone, at least one second measurement antenna, wherein the second measurement antenna is arranged inside the test chamber such to generate a second quiet zone at test surface, an input/output terminal for connecting the test chamber to a test equipment, wherein the input/output terminal is connected to the first and second antennas.

19 Claims, 2 Drawing Sheets

(56) References Cited

U.S. PATENT DOCUMENTS

2011/0084887 A1     4/2011   Mow et al.
2017/0012714 A1*   1/2017   Kildal .................. H04B 17/102
2018/0375594 A1*   12/2018   Kildal .................. H04B 17/102

* cited by examiner

ANECHOIC TEST CHAMBER, TEST SYSTEM AND TEST METHOD FOR TESTING THE ANTENNAS OF A DEVICE UNDER TEST

FIELD OF THE INVENTION

The present invention relates to an anechoic test chamber for testing antennas of a device under test. The invention further relates to a test system comprising such a test chamber and to a test method for testing antennas of a device under test using such a test chamber.

TECHNICAL BACKGROUND

Wireless electronic devices, such as cellular phones and other wireless electronic devices, have wireless capabilities. These wireless capabilities may be used to support voice and data communication. During manufacturing, wireless electronic devices are generally tested to determine whether their wireless functions are operating properly. Testing the antennas and in particular their characteristics is of particular importance. For this purpose and in order to provide reliable test results, the wireless electronic devices are tested using suitable test equipment which includes a closed and anechoic RF shielded room, box or chamber. During testing, the wireless electronic devices are placed inside the anechoic test chamber which includes an antenna that is connected to the test equipment. The test equipment may use the antenna to communicate wirelessly with the wireless electronic devices during testing. Such a test chamber is described in US 2010/0113011 A1.

The so-called compact antenna test range (CATR) is a widely deployed technique for broadband characterization of electrically large antennas at reduced range lengths. An off-set reflector is generally used to generate a quiet zone of the CATR. There are several types of CATRs which differ in particular with regard to the reflector. The nature of the curvature and position of the parabolic reflector as well as its edge geometry ensures that the resulting collimated field is comprised of a pseudo transverse electric and magnetic (TEM) wave. Thus, by projecting an image of the feed at infinity, the CATR synthesizes the type of wavefront that would be incident on the antenna of the DUT if the antenna were located very much further away from the feed than is actually the case with the coupling of the plane-wave into the aperture of the antenna creating the classical measured "far-field" radiation pattern.

Modern wireless electronic devices comprise not only a single antenna. Instead, those wireless electronic devices typically comprise at least two antenna arrays—so-called multiple-input multiple-output (MIMO) antennas—which are optimized with regard to different signal wavelength, intensity, amplitude, direction, etc. Further, signals are very often transferred from one channel or antenna to another. In telecommunication, this process is denoted as handover.

Conventional test equipment which employ only one CATR are not capable to test this specific handover function of modern wireless electronic devices.

This is a situation that needs to be improved.

SUMMARY OF THE INVENTION

Against this background, it would therefore be desirable to provide improved ways for the testing of wireless electronic devices such as cellular phones. In particular it would be desirable to provide spatial MIMO measurements.

This problem is achieved according to the invention by a test chamber and/or by a test system and/or by a method as defined in the main claims.

According thereto, the following is provided:

A anechoic test chamber for testing antennas of a devices under test (DUT), the test chamber comprising: a test area having a test surface for receiving the DUT, wherein in a test mode the test surface forms a region of measurement of the DUT and wherein the DUT comprises at least one antenna array having a plurality of multi-input multi-output (MIMO) antennas, at least one reflector compact antenna test range (CATR) comprising a first measurement antenna and one shaped reflector, wherein the reflector is used to generate a first quiet zone, at least one second measurement antenna, wherein the second measurement antenna is arranged inside the test chamber such to generate a second quiet zone at test surface, an input/output terminal for connecting the test chamber to a test equipment, wherein the input/output terminal is connected to the first and second antennas.

A test system for testing devices under test (DUT), the test system comprising: an anechoic test chamber according to the present invention, a test equipment connected to the input/output terminal and configured to transmit via the CATR and the at least one second antenna a test data stream a DUT which is placed on the test surface and to receive and to analyse corresponding response data streams.

A test method for testing devices under test, in particular by employing a test system according to the present invention, the method comprising: providing a DUT wherein the DUT comprises at least two MIMO antenna arrays, placing the DUT on a test surface inside a test chamber of a test system; generating on the test surface a large first quiet zone by using the CATR such that the DUT is fully arranged within the first quiet zone; generating on the test surface a smaller second quiet zone by using at least one further measurement antenna such that the second quiet zone is smaller than the first quiet zone and/or is overlapping the first quiet zone; performing MIMO type measurement by analysing a first received data stream in response to a first test stream sent via the CATR and by analysing a second received data stream in response to a second test stream sent via the further antenna.

The present invention is based on the idea to be able to do spatial MIMO measurements on a device under test, such as a wireless electronic device, for which two measurement antennas are needed. Accordingly it is a finding of the present invention to provide not only one, but at least two quite zones for the testing of a DUT which has spatially separated antenna arrays. A quiet zone is an area where radio transmissions are restricted or at least reduced.

A first quiet zone is generated by employing a specific CATR within a test chamber. This test chamber is a closed and shielded test chamber for wirelessly testing DUTs. The CATR comprises a first measurement antenna and a shaped reflector. The first measurement antenna is arranged inside the test chamber with regard to the shaped reflector such and the shaped reflector is shaped and arranged inside the test chamber such to form a first quiet zone on the test surface.

This CATR uses a specific MIMO antenna which is sending a test data stream in the direction of a specifically shaped reflector. The reflector is arranged and shaped such that the reflected test data stream is focused on a first quiet zone on the test surface. If the DUT is placed in the area of this first quiet zone its antennas or antenna arrays may be tested. Additionally, a second quiet zone is generated using a spatially separated second MIMO antenna which is sending a second test data stream. This second MIMO antenna is arranged and shaped such that the test data stream is focused on a second quiet zone on the test surface. If the DUT is placed in the area of this first and second quiet zone, conformance testing for the antennas of the DUT is possible.

By providing at least two measurement antennas and thus generating at least two quiet zones on the test surface it is possible to test DUTs having the same number of antennas or antenna arrays. In particular, it is now possible to test a handover from one DUT antenna (or antenna array) to another DUT antenna (or antenna array). Additionally, radio resource management (RRM)) testing is also possible with this setup.

The present invention generally provides optimized antenna measurement which is needed for the testing of antennas to ensure that the antenna meets specifications or simply to characterize it. Typical parameters of antennas are gain, radiation radiation pattern, beamwidth, polarization, impedance and the like.

The solution according to the present invention is easy to integrate and provides a preferable extension for existing compact antenna test range (CATR) systems.

Advantageous configurations and developments emerge from the further dependent claims and from the description with reference to the figures of the drawings.

In a preferred embodiment, the first quiet zone is larger than the second quiet zone. In particular, the second quiet zone is an integral part of the first quiet zone. This way the handover can be tested even more effectively for example if the first quiet zone covers as well the first DUT antenna (array) and the second DUT antenna (array) and if the second quiet zone covers only one of the DUT antennas (arrays).

According to a further preferred embodiment, the first quiet zone and the second quiet zone are overlapping each other. Overlapping means that the resulting overlapping area is smaller than as well the first quiet zone and the second quiet zone.

In a preferred embodiment, the CATR and in particular its reflector is configured to create the first quiet zone on the test surface such that the created first quiet zone is capable to entirely cover the DUT when placed on the test surface.

In a further preferred embodiment, the at least one second measurement antenna is configured to create the second quiet zone on the test surface such that the created second quiet zone is capable to cover the DUT only partially when placed on the test surface.

Preferably, the first and/or second measurement antennas are horn antennas. In particular, the first and/or second measurement antennas are directional antennas. A horn antenna or microwave horn is an antenna that consists of a flaring metal waveguide shaped like a horn to direct radio waves in the form of a beam. They are used as feed antennas for standard calibration antennas to measure the gain and other properties of other antennas, and as directive antennas. Their advantages are moderate directivity, simple construction and adjustment. A further significant advantage of horn antennas is that since they have no resonant elements, they can operate over a wide range of frequencies and a wide bandwidth up to the GHz area. However, instead of horn antennas also other types of antennas are possible, such as a direct-broadcast satellite reflector antenna or a local microwave distribution antenna.

In a preferred embodiment, the CATR and the second measurement antenna are arranged inside the test chamber such and are configured to test at least two spatially distanced MIMO antenna arrays of a DUT. For example, a first MIMO antenna or antenna array of the DUT comprises far field-antennas and/or a second MIMO antenna or antenna array of the DUT which is spatially distanced from the first MIMO antenna array comprises near field-antennas. Wireless electronic devices usually employ such antenna arrays since such an antenna array can achieve higher gain that (i.e. a narrower beam of radio waves) than could be achieved by a single antenna. An antenna array is a set of multiple connected antenna elements which work together as a single antenna, in order to transmit or receive radio waves.

In a particularly preferred embodiment, a first setting mechanism is provided which is coupled to or connected with the shaped reflector of the CATR. The first setting mechanism is configured such to change the shape of the reflector and/or the direction of the beam reflected by the reflector during a test mode. Additionally, or alternatively, a second setting mechanism is provided which is coupled to or connected with the first and/or second measurement antenna. The second setting mechanism is configured such to change during a test mode the direction of the beam transmitted by the first measurement antenna or the second measurement antenna, respectively. This way, it is possible to vary the test conditions in situ, i.e. during on ongoing test, without stopping the test mode and/or without the need of a replacement of the DUT inside the test chamber.

According to a preferred embodiment, a first adjustment mechanism is provided which is coupled to or connected with the test zone. The first adjustment mechanism is configured such to move the test zone in at least one dimension (x,y or z direction). Additionally, or alternatively, a second adjustment mechanism is provided which during a test mode is connectable with the DUT. The second adjustment mechanism is configured such to move the DUT relative to the first and/or second quiet zone. With these embodiments it is possible to additionally vary the test conditions in situ.

Typically, the test equipment comprises a signal generation device for generating a test data stream and an analysis device for analysing received response data streams.

In an embodiment of the method, the DUT is placed on the test surface such that all MIMO antenna arrays of the DUT are fully arranged within the first quiet zone and are only partially arranged within the second quiet zone.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

The present invention is described in greater detail in the following on the basis of the embodiments shown in the schematic figures of the drawings, in which.

Figure 1:
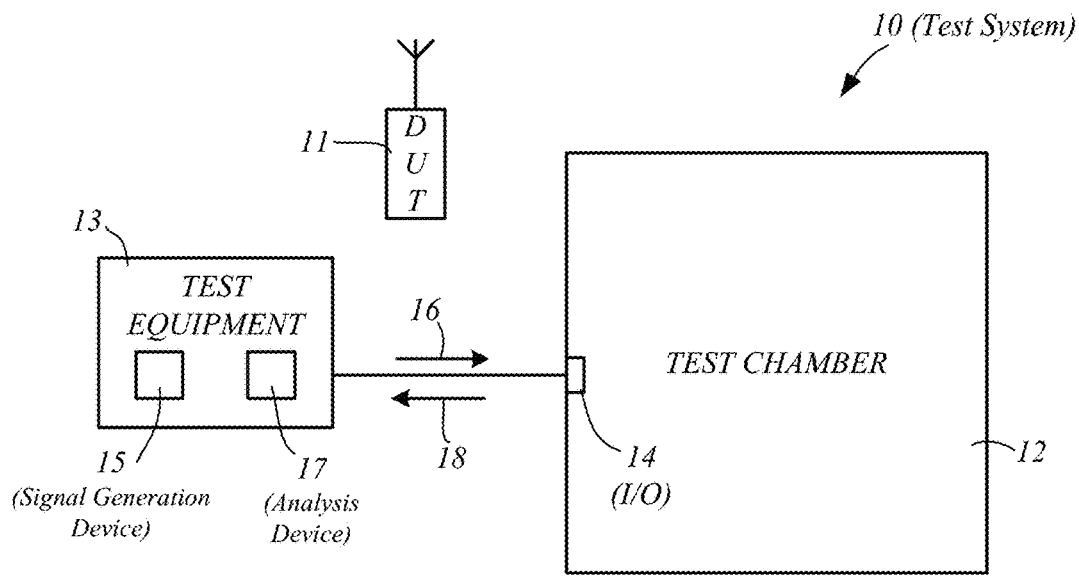
FIG. 1 shows a block diagram of a test system for testing the antennas of a device under test according to the invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

FIG. 1 shows a block diagram of a test system for testing the antennas of a device under test according to the invention.

In FIG. 1, the test system is denoted by reference numeral 10. The test system 10 is configured to test a device under test (DUT) 11. For this purpose, the test system 10 includes an anechoic test chamber 12 and a test equipment 13. The test chamber 12 comprises at least one input/output (i/o) terminal 14. The test equipment 13 is connected via suitable electric cable and connectors to the input/output terminal 14 of the test chamber 12.

The test equipment 13 comprises a signal generation device 15 for generating a test data stream 16 which is provided to the test chamber 12. The test equipment 13 further comprises an analysis device 17 for analysing corresponding response data streams 18 which the test equipment 13 receives in response to the transmitted data stream 16.

For testing purposes the DUT 11 is placed inside the test chamber 12. This is described in the following with regard to FIGS. 2-4.

Figure 2:
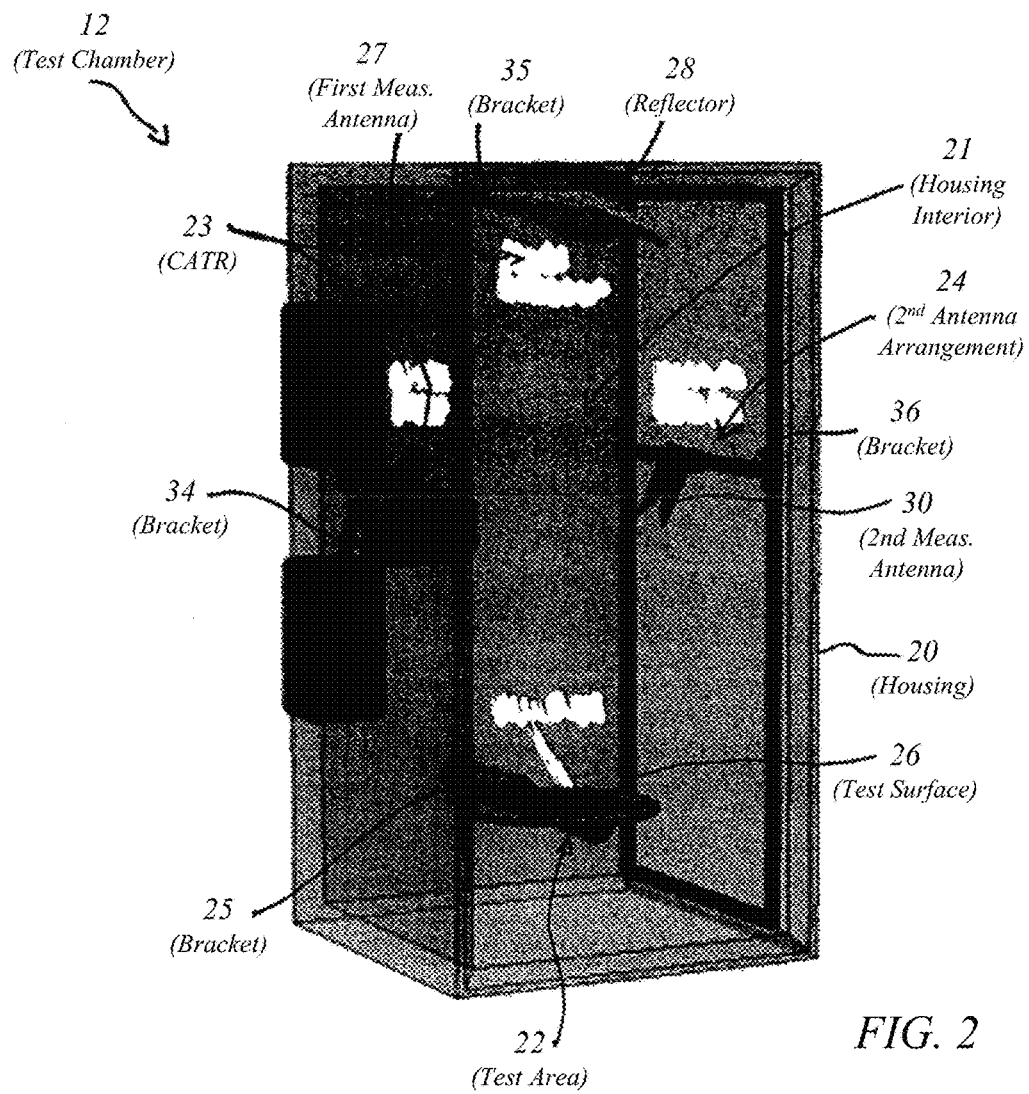
FIG. 2 shows a perspective view on a test chamber of a test system of FIG. 1.

FIG. 2 shows a perspective view on a test chamber 12 of a test system 10 of FIG. 1.

In the embodiment of FIG. 2 the test chamber 12 is a closed cabinet-shaped apparatus. However, the present invention should not be restricted to this kind of test chamber shapes. Moreover, the test chamber 12 may also be a room, a chamber, a cupboard, a box, a package, or the like. The test chamber 12 is shielded in a suitable manner, in particular against electric and electronic interferences, such as RF signals and noise.

The test chamber 12 is configured to wirelessly testing DUTs 11, in particular the antennas of mobile communication devices, such as smart phones, tablets, cellular phones, etc. More particular, the test chamber 12 is RF test chamber 12 which is configured to test the antennas of those DUTs. For this purpose, the test chamber 12 is configured to cope with all requirements of automatic production lines. These requirements include automatic opening and closing of the RF chamber 12 and a long service life. The test chamber 12 provide a high shielding effectiveness over a wide frequency range which enables it to perform tests on DUTs which have a radio interface in accordance with numerous standards. These include GSM, ISM, LTE, cdma2000, WCDMA, WiMAX, Bluetooth, WLAN and ZigBee. An automatic and/or manual handling of the test chamber 12 may also be available.

The test chamber 12 comprises a housing 20 with a housing interior 21. Suitable shielding elements (not shown in FIG. 2) are attached to the interior walls of the housing 20 to ensure an optimal test environment.

The test chamber 12 further comprises a test area 22, a CATR 23 (or first antenna arrangement) and a second antenna arrangement 24.

The test area 22 is located more or less centrally inside the housing interior 21 and is attached to the housing wall via a bracket 25. The test area 22 comprises a test surface 26 for receiving a DUT 11.

The CATR 23 is comprised of at least one first measurement antenna 27 and one suitably shaped reflector 28. The first measurement antenna 27 and the shaped reflector 28 are mounted on the housing wall by means of suitable brackets 34, 35. In the embodiment of FIG. 2, the first measurement antenna 27 is mounted on the left housing wall via bracket 34 and the shaped reflector 28 is mounted on top housing wall via bracket 35.

The CATR 23 forms a first quiet zone 29 on the test surface 26. This quiet zone 26 has—depending on the shape of the reflector 28—approximately a size A×A.

Preferably, the first measurement antenna 27 is a horn antenna. The first measurement antenna 27 is configured and aligned in such a way that a signal emitted by it is directed directly to the reflector 28. The reflector 28 is shaped, mounted on the wall and aligned such to reflect the received signal from the first measurement antenna 27 directly onto the test surface 26.

The second antenna arrangement 24 is comprised of at least one second measurement antenna 30 which is mounted on the housing wall by means of a suitable bracket 36. In the embodiment of FIG. 2, the second measurement antenna 27 is mounted on the right housing wall. The second measurement antenna 30 may be any directional antenna which is configured to direct a signal directly—i.e. without a reflector—onto the test surface 26. The second antenna arrangement 24 forms a second quiet zone 31 which has—depending on the directional effect of the second measurement antenna 30—approximately a size B×B.

The second antenna arrangement 24 may also be a CATR.

Both antenna arrangements 23, 24 are connected via the input/output terminal to the test equipment 13.

In a test mode, the DUT 11 is placed on the test surface 26 and the test surface 26 forms a region of measurement for the DUT 11.

The test chamber 13 according to the present invention is in particular capable for testing a DUT 11 having at least two spatially distanced multiple-input multiple-output (MIMO) antenna arrays 32, 33. For example, a first MIMO antenna array 32 comprises far field-antennas and a second spatially distanced MIMO antenna array 33 comprises near field-antennas.

The test chamber 12 may comprise setting means (not shown in FIG. 2) for setting and/or varying the positions and directions of the feed measurement antennas and/or the reflector. The test chamber 12 may also comprise adjusting means (not shown in FIG. 2) for varying the positions of the test surface or of the DUT. With these mechanisms it is possible to change the measurement conditions during the test without the need of interrupting an on-going test.

Figure 3:
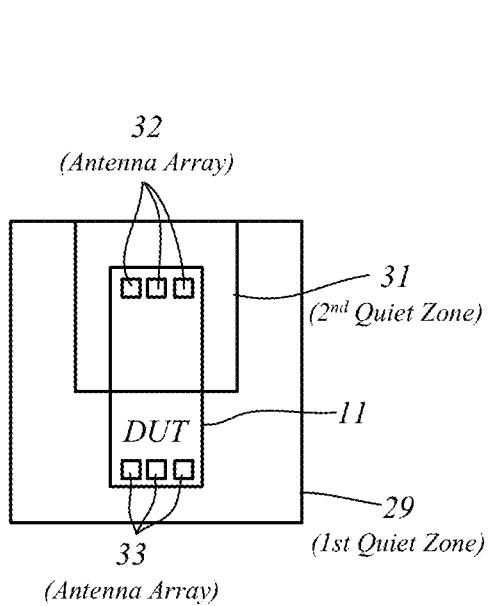
FIG. 3 shows a first embodiment of the arrangement of the first and second quiet zones in a projected top view on the test area.
Figure 4:
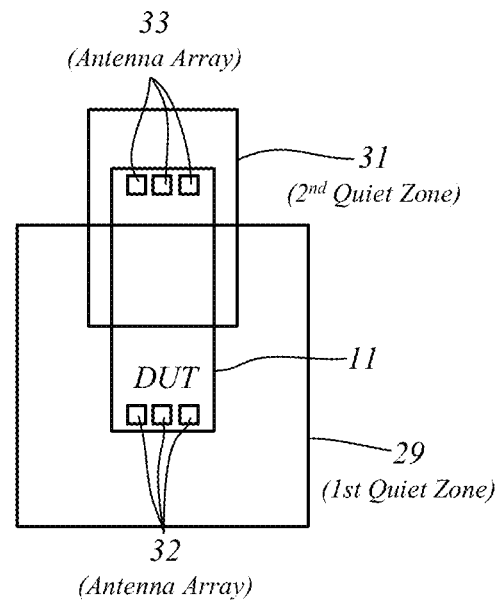
FIG. 4 shows a second embodiment of the arrangement of the first and second quiet zones in a projected top view on the test area.

FIG. 3-4 show two embodiments for the arrangement of the second quiet zone 31 with regard to the first quiet zone 29 in a projected top view.

In FIG. 3, the size A×A of the first quiet zone 29 is larger than the size B×B of the second quiet zone 31. Here, the second quiet zone 31 is an integral part of the first quiet zone 29 and as such is fully included within the first quiet zone 29.

In FIG. 4, the first quiet zone 29 is again larger than the second quiet zone 31. However, here the first quiet zone 29 and the second quiet zone 31 are overlapping each other.

In both embodiments of FIGS. 3 and 4, the first quiet zone 29 entirely covers the DUT 11 when placed on the test surface 26. The second quiet zone 31 only covers the DUT 11 partially when placed on the test surface 26.

In FIG. 3, the first antenna array 32 of the DUT 11 is covered by both quiet zones 29, 31. The second antenna array 33 of the DUT 11 is covered only by the first quiet zone 29.

In FIG. 4, the first antenna array 32 of the DUT 11 is covered only by the first quiet zone 29. The second antenna array 33 of the DUT 11 is covered only by the second quiet zone 31.

Figure 5:
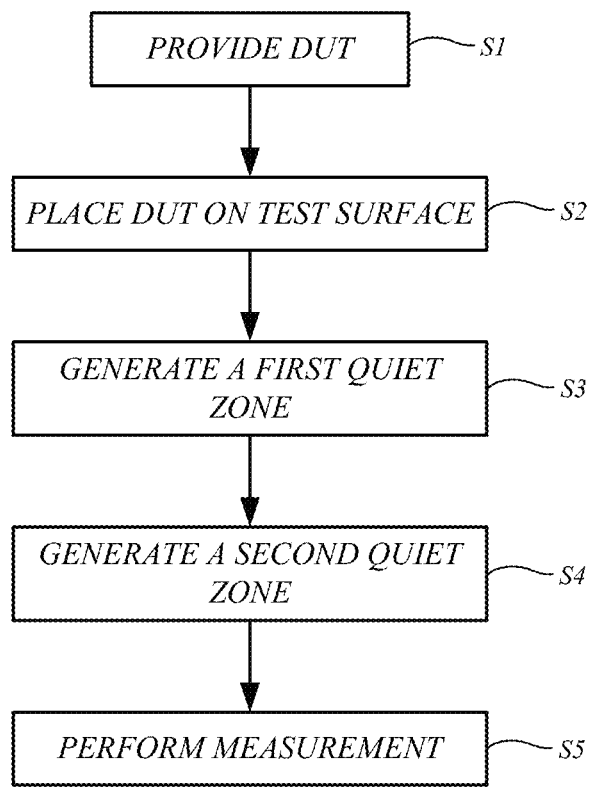
FIG. 5 shows a flow diagram for illustrating a method according to the present invention.

FIG. 5 shows a flaw diagram for illustrating a method for testing the antennas of a device under test according to the present invention.

In a first step (S1), a DUT is provided. This DUT comprises at least two spatially distanced MIMO antenna arrays.

In a second step (S2), the DUT is placed on a specific test surface which is provided by a test area inside a test chamber of a test system. The test chamber is then closed.

In a next step (S3), a first quiet zone is generated on the test surface by employing a CATR. The DUT is fully arranged within this first quiet zone.

In an additional step (S4), which may be done before or after step S3, a second quiet zone is generated on the test surface by using at least one further measurement antenna. The second quiet zone is smaller than the first quiet zone and/or the second quiet zone is overlapping the first quiet zone. In particular, the DUT is placed on the test surface such that the MIMO antenna arrays of the DUT are fully arranged within the first quiet zone and partially arranged within the second quiet zone.

In a final step (S5), MIMO type measurement is performed using the CATR and the further measurement antenna. During the test mode a first received data stream is analysed which is received in response to a first test stream sent via the CATR. Further, a second received data stream is analysed which is received in response to a second test stream sent via the further antenna.

Although the present invention has been described in the above by way of preferred embodiments, it is not limited thereto, but rather can be modified in a wide range of ways. In particular, the invention can be changed or modified in various ways without deviating from the core of the invention.

The invention claimed is:

1. An anechoic test chamber suitable for testing antennas of such wireless devices under test, DUT, which comprise at least one antenna array having a plurality of spatially distanced or separated multi-input multi-output (MIMO) antennas, the test chamber comprising:
    a test area having a test surface for receiving the DUT, wherein in a test mode the test surface forms a region of measurement of the DUT,
    at least one reflector compact antenna test range, CATR, comprising a first measurement antenna and one shaped reflector, wherein the first measurement antenna is arranged inside the test chamber with regard to the shaped reflector such and the shaped reflector is shaped and arranged inside the test chamber such to generate a first quiet zone on the test surface,
    at least one second measurement antenna, wherein the second measurement antenna is arranged inside the test chamber such to generate a second quiet zone at the test surface such that the second quiet zone is smaller than the first quiet zone, and
    an input/output terminal for connecting the test chamber to a test equipment, wherein the input/output terminal is connected to the first and second measurement antennas.

2. The test chamber of claim 1, wherein the first quiet zone is larger than the second quiet zone.

3. The test chamber of claim 2, wherein the second quiet zone is an integral part of the first quiet zone.

4. The test chamber of claim 1, wherein the first quiet zone and the second quiet zone are overlapping each other.

5. The test chamber of claim 1, wherein the CATR is configured to create the first quiet zone on the test surface such that the created first quiet zone is capable to entirely cover the DUT when placed on the test surface.

6. The test chamber of claim 5, wherein the reflector of the CATR is configured to create the first quiet zone on the test surface such that the created first quiet zone is capable to entirely cover the DUT when placed on the test surface.

7. The test chamber of claim 1, wherein the at least one second measurement antenna is configured to create the second quiet zone on the test surface such that the created second quiet zone is capable to cover the DUT partially when placed on the test surface.

8. The test chamber of claim 1, wherein at least one of the first and second measurement antennas are horn antennas.

9. The test chamber of claim 1, wherein the test area, the CATR and the second measurement antenna are arranged inside the test chamber such and are configured to test at least two spatially distanced MIMO antenna arrays of a DUT.

10. The test chamber of claim 1, wherein the test area, the CATR and the second measurement antenna are arranged inside the test chamber such and are configured to test a far field-antenna and a spatially distanced near field-antenna.

11. The test chamber of claim 1, wherein a first setting mechanism is provided which is coupled to the reflector and which is configured such to change the shape of the reflector during a test mode.

12. The test chamber of claim 1, wherein a first setting mechanism is provided which is coupled to the reflector and which is configured such to change the direction of the beam reflected by the reflector during a test mode.

13. The test chamber of claim 1, wherein a second setting mechanism is provided which is coupled to at least one of the first and second measurement antenna and which is configured such to change during a test mode the direction of the beam transmitted by the first measurement antenna or the second measurement antenna, respectively.

14. The test chamber of claim 1, wherein a first adjustment mechanism is provided which is coupled to the test zone and which is configured such to move the test zone in at least one dimension.

15. The test chamber of claim 1, wherein a second adjustment mechanism is provided which during a test mode is connectable with a DUT and which is configured such to move the DUT with regard to at least one of the first quiet zone and second quiet zone.

16. A test system for testing antennas of a device under test, DUT, the test system comprising:
- an anechoic test chamber suitable for testing antennas of a DUT, which comprises at least one antenna array having a plurality of spatially distanced or separated multi-input multi-output (MIMO) antennas, the test chamber comprising:
  - a test area having a test surface for receiving the DUT, wherein in a test mode the test surface forms a region of measurement of the DUT;
  - at least one reflector compact antenna test range, CATR, comprising a first measurement antenna and one shaped reflector, wherein the first measurement antenna is arranged inside the test chamber with regard to the shaped reflector such and the shaped reflector is shaped and arranged inside the test chamber such to generate a first quiet zone on the test surface;
  - at least one second measurement antenna, wherein the second measurement antenna is arranged inside the test chamber such to generate a second quiet zone at the test surface such that the second quiet zone is smaller than the first quiet zone;
  - an input/output terminal for connecting the test chamber to a test equipment, wherein the input/output terminal is connected to the first and second measurement antennas; and
  - a test equipment connected to the input/output terminal and configured to transmit via the CATR and the at least one second antenna a test data stream to a DUT which is placed on the test surface and to receive and to analyse corresponding response data streams.

17. The test system of claim 16, wherein the test equipment comprises a signal generation device for generating test data streams and wherein the test equipment further comprises an analysis device for analysing the received response data streams.

18. A test method for testing antennas of a device under test, DUT, the method comprising:
- providing a DUT wherein the DUT comprises at least two spatially distanced or separated MIMO antenna arrays,
- placing the DUT on a test surface inside a test chamber of a test system;
- generating on the test surface a large first quiet zone by using the CATR such that the DUT is fully arranged within the first quiet zone;
- generating on the test surface a smaller second quiet zone by using at least one further measurement antenna such that the second quiet zone is smaller than the first quiet zone or is overlapping the first quiet zone;
- performing MIMO type measurement by analysing a first received data stream in response to a first test stream sent via the CATR and by analysing a second received data stream in response to a second test stream sent via the further antennas,
- wherein the step of placing the DUT on a test surface comprises placing the DUT on the test surface such that the MIMO antenna arrays of the DUT are fully arranged within the first quiet zone and partially arranged within the second quiet zone.

19. The method of claim 18, wherein the method is employing a test system and wherein the test system comprises:
- an anechoic test chamber suitable for testing antennas of a DUT, which comprises at least one antenna array having a plurality of spatially distanced or separated multi-input multi-output (MIMO) antennas, the test chamber comprising:
  - a test area having a test surface for receiving the DUT, wherein in a test mode the test surface forms a region of measurement of the DUT;
  - at least one reflector compact antenna test range, CATR, comprising a first measurement antenna and one shaped reflector, wherein the first measurement antenna is arranged inside the test chamber with regard to the shaped reflector such and the shaped reflector is shaped and arranged inside the test chamber such to generate a first quiet zone on the test surface;
  - at least one second measurement antenna, wherein the second measurement antenna is arranged inside the test chamber such to generate a second quiet zone at the test surface such that the second quiet zone is smaller than the first quiet zone;
  - an input/output terminal for connecting the test chamber to a test equipment, wherein the input/output terminal is connected to the first and second measurement antennas; and
  - a test equipment connected to the input/output terminal and configured to transmit via the CATR and the at least one second antenna a test data stream to a DUT which is placed on the test surface and to receive and to analyse corresponding response data streams.

* * * * *